(12) United States Patent
Landrith et al.

(10) Patent No.: US 6,714,086 B1
(45) Date of Patent: Mar. 30, 2004

(54) SYMMETRIC OSCILLATORS

(75) Inventors: James Edward Landrith, Andover, NJ (US); William J. Tanis, Wayne, NJ (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 156 days.

(21) Appl. No.: 09/758,709

(22) Filed: Jan. 11, 2001

Related U.S. Application Data
(60) Provisional application No. 60/238,224, filed on Oct. 5, 2000.

(51) Int. Cl.$^7$ .................................................. H03B 5/12
(52) U.S. Cl. ................. 331/56; 331/107 R; 331/117 R; 331/117 FE; 331/177 V; 331/96; 331/107 SL; 331/167
(58) Field of Search ............................. 331/56, 107 R, 331/177 V, 117 R, 107 SL, 96, 117 FE, 167, 114

(56) References Cited

U.S. PATENT DOCUMENTS 6,326,854 B1 * 12/2001 Nicholls et al. .............. 331/56
6,429,748 B2 * 8/2002 Nicholls et al. .............. 331/56

OTHER PUBLICATIONS

Cheh–Ming Liu and Chen Y. Ho, "On The Design Of A Voltage–Tuned Push–Push Dielectric Resonator Oscillator," Mircrowave Journal, pp. 165, 166, 168, 170, 172, 173, 174, (Jun. 1990).

Anthony M. Pavlo and Mark A. Smith, "Push–Push Dielectric Resonator Oscillator," Article, IEEE Digest, pp. 266–269, (1985).

F.X. Sinnesbichler, H. Geltinger and G.R. Olbrich, "A 50 GHz SiGe HBT Push–Push Oscillator," Article, (4 pages).

John R. Bender and Colman Wong, "Push–Push Design Extends Bipolar Frequency Range," Microwave & RF, pp. 91, 92, 94, 96, 98, (Oct. 1983).

Zvi Nativ and Yair Shur, "Push–Push VCO Design With CAD Tools," Microwave Journal, pp. 127–130, 132, (Feb. 1989).

Kevin W. Kobayashi, Aaron K. Oki, Liem T. Tran, John C. Cowles, Augusto Gutierrez–Aitken, Frank Yamada, Thomas R. Block and Dwight C. Streit, "A 108–GHz InP–HBT Monolithic Push–Push VCO With Low Phase Noise And Wide Tuning Bandwith," IEEE Journal Of Solid–State Circuits, vol. 34, No. 9, pp. 1225–1232, (Sep. 1999).

* cited by examiner

Primary Examiner—Arnold Kinkead
(74) Attorney, Agent, or Firm—RatnerPrestia

(57) ABSTRACT

A symmetrical oscillator includes a reactive element, such as an inductor, coupled between first and second active components, where the reactive element defines a fundamental resonant frequency with one or more capacitances of the oscillator. A first feedback circuit is coupled between the first active component and a common node, while a second feedback circuit is coupled between the second active component and the common node such that an output signal at substantially twice the fundamental resonant frequency is obtained at the common node.

76 Claims, 8 Drawing Sheets

SYMMETRIC OSCILLATORS

CROSS REFERENCE TO RELATED APPLICATIONS

This application claims the benefit of U.S. Provisional Patent Application No. 60/238,224, filed Oct. 5, 2000, entitled Push-Push Oscillator Having Non-Resonator Related Output Coupling And Suppression Of Fundamental Frequency, And Symmetrical Oscillator Having Simultaneously Connected Fundamental And Doubled Frequency Output Ports, the entire disclosure of which is hereby incorporated by reference.

BACKGROUND OF THE INVENTION

The present invention is related to symmetrical oscillators of the push-push configuration and, more particularly, to push-push symmetrical oscillators from which multiple outputs may be obtained or from which outputs may be obtained from portions of the oscillator other than from an inductive element.

Symmetrical push-push oscillators have become popular for use in countermeasures and surveillance systems, test signal generators, military electronic systems, and telecommunications equipment. These oscillators are typically designed for use in the 2.0–20 GHz range. FIG. 1 is a simplified circuit diagram of a common-collector bipolar transistor implementation of a, known push-push symmetrical oscillator 1. The symmetrical oscillator 1 includes an inductor Lr, a first bipolar transistor Q1, a second bipolar transistor Q2, first and second capacitors C1, C4, first and second shunt capacitors C2, C5, and first and second feedback capacitors C3, C6. The first and second capacitors C1, C4 connect each end of inductor Lr to respective bases of transistors Q1 and Q2. Each of transistors Q1, Q2 include a respective one of the shunt capacitors C2, C5 across its base-emitter terminals. Respective ones of the feedback capacitors C3, C6 are coupled between the collector-emitter terminals of transistors Q1, Q2. The collectors of transistors Q1, Q2 are connected to ground. The inductor Lr has a center tap from which an output signal at node 2 is taken. Assuming that inductor Lr may be represented by two equal inductances L on each side of the center tap, and an equivalent capacitatance C exists from each inductance L to ground, a fundamental resonant frequency Fr may be obtained that adheres to the following equation:

$$Fr=1/(2\pi\sqrt{(LC)}).$$

Due to non-linearities of the electrical components of the symmetrical oscillator 1, currents flowing in the circuit include frequency components at the fundamental resonant frequency, F, twice the fundamental resonant frequency, 2F, etc. When the symmetrical oscillator 1 is properly tuned, transistors Q1 and Q2 operate 180° out of phase with one another and, therefore, voltages at the fundamental resonant frequency F cancel at the electrical center of inductor Lr. Further, voltages at twice the fundamental resonant frequency, 2F, are additive at the electrical center of inductor Lr and, therefore, an output signal taken at the center tap 2 will be rich in energy at 2F. Additional details concerning the operation of the symmetrical oscillator 1 of FIG. 1 may be found in John R. Bender and Colmon Wong, PUSH-PUSH DESIGN EXTENDS BIPOLAR FREQUENCY RANGE, Microwaves & RF pp. 91–98 (October 1983), the entire disclosure of which is hereby incorporated by reference.

It would be desirable to obtain two output signals from a symmetrical oscillator, one at the fundamental resonant frequency, and the other at twice the fundamental resonant frequency. Preferably each output would be electrically and/or mechanically isolated from one another. It would also be desirable to obtain an output signal at twice the fundamental resonant frequency of the symmetrical oscillator, which output signal enjoys a relatively high power level and a substantially flat response over a frequency range of interest. It would also be desirable that the output signal be taken from a point in the circuit other than from a tap on the inductor or through inductive coupling.

SUMMARY OF THE INVENTION

In accordance with at least one aspect of the invention, a symmetrical oscillator includes: a first active component having a drive terminal and first and second gain terminals, one of the first and second gain terminals of the first active component being coupled to a first reference node; a second active component having a drive terminal and first and second gain terminals, one of the first and second gain terminals of the second active component being coupled to the first reference node; a reactive element coupled between the drive terminals of the first and second active components, the reactive element at least partially defining a fundamental resonant frequency; a first feedback circuit having at least one reactive component coupled between the other of the first and second gain terminals of the first active component and a common node; and a second feedback circuit having at least one reactive component coupled between the other of the first and second gain terminals of the second active component and the common node, wherein an output signal is taken from at least one of the reactive element, the common node, and the first reference node.

In accordance with at least one other aspect of the invention, a symmetrical oscillator includes: a first active component having a drive terminal and first and second gain terminals, one of the first and second gain terminals of the first active component being coupled to a first reference node; a second active component having a drive terminal and first and second gain terminals, one of the first and second gain terminals of the second active component being coupled to the first reference node; a first reactive element coupled between the other of the first and second gain terminals of the first active component and the drive terminal of the first active component; a second reactive element coupled between the other of the first and second gain terminals of the second active component and the drive terminal of the second active component, the first and second reactive elements at least partially defining a fundamental resonant frequency; a first shunt circuit having at least one reactive component coupled between the drive terminal of the first active component and a common node; and a second shunt circuit having at least one reactive component coupled between the drive terminal of the second active component and the common node; and a feedback circuit coupled between the others of the first and second gain terminals of the first and second active components, wherein an output signal is taken from at least one of the feedback circuit, the common node, and the first reference node.

In accordance with at least one other aspect of the invention, a symmetrical oscillator includes: a first active component having a drive terminal and first and second gain terminals, the drive terminal of the first active component being coupled to a first reference node; a second active component having a drive terminal and first and second gain terminals, the drive terminal of the second active component being coupled to the first reference node; a reactive element coupled between one of the first and second gain terminals of the first active component and one of the first and second gain terminals of the second active component, the reactive element at least partially defining a fundamental resonant frequency; a first shunt circuit having at least one reactive component coupled between the other of the first and second gain terminals of the first active component and a common node; and a second shunt circuit having at least one reactive component coupled between the other of the first and second gain terminals of the second active component and the common node, wherein an output signal is taken from at least one of the reactive element, the common node, and the first reference terminal.

Other objects, features, and/or advantages will become apparent to one skilled in the art in view of the disclosure herein.

BRIEF DESCRIPTION OF THE DRAWINGS

For the purposes of illustrating the invention, there are shown in the drawings forms which are presently preferred, it being understood, however, that the invention is not limited to the precise arrangements and/or instrumentalities shown.

DETAILED DESCRIPTION

Figure 2:
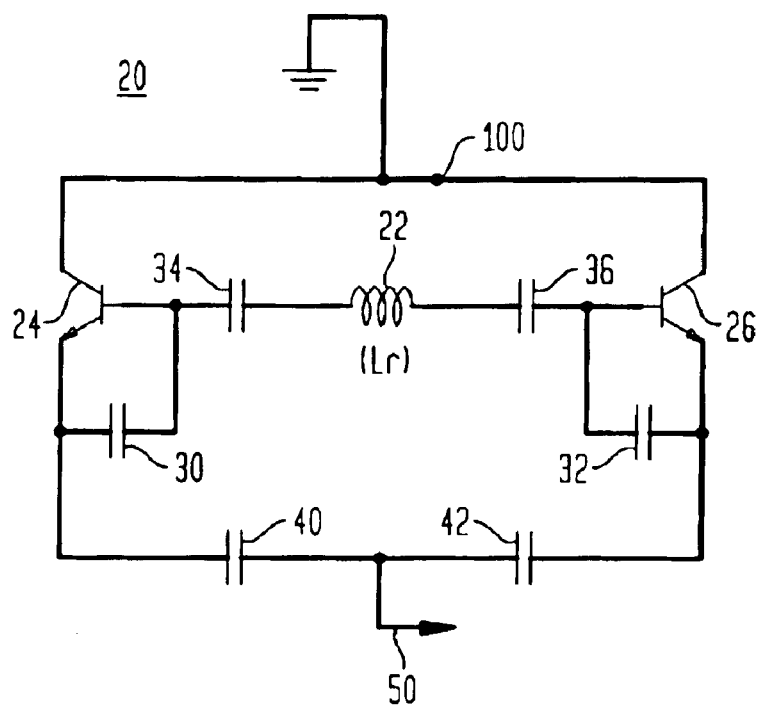
FIG. 2 is a simplified schematic diagram of a symmetrical oscillator in accordance with one or more aspects of the present invention.

Referring now to the drawings, wherein like numerals indicate like elements, there is shown in FIG. 2 a simplified schematic diagram illustrating a symmetrical oscillator 20 in accordance with one or more aspects of the present invention. The symmetrical oscillator 20 includes first and second active components 24, 26, preferably any suitable transistors. For the purposes of discussion, the first and second active components 24, 26 each include a drive terminal and first and second gain terminals. By way of example, bipolar NPN transistors are shown in FIG. 2 as the first and second active components 24, 26, where each transistor 24, 26 includes a base (i.e., the drive terminal), an emitter (i.e., one of the gain terminals), and a collector (i.e., the other of the gain terminals). The first and/or second active components 24, 26 may be taken from the group consisting of bipolar transistors, field effect transistors, heterojunction bipolar transistors, silicon-germanium transistors, insulated gate bipolar transistors, and vacuum tubes. As the symmetrical oscillator 20 is preferably designed to operate with low noise performance at microwave frequencies, the first and second active components 24, 26 are preferably implemented using low noise transistor technology (bipolar technology being often most preferred).

The symmetrical oscillator 20 also includes a reactive element 22 (such as an inductor Lr and/or a capacitor), coupled between the drive terminals of the first and second active components, 24, 26. The reactive element 22 is preferably coupled to each of the drive terminals (i.e., the bases) of the first and second active components 24, 26 by way of first and second capacitors 34, 36, respectively. Each of the first and second active component 24, 26 preferably include a capacitor, coupled between its drive terminal and one of its first and second gain terminals. For example, when the first and second active components 24, 26 are bipolar transistors as shown, each preferably includes a shunt capacitor 30, 32 coupled between the base and emitter thereof. It is noted that one or both of the shunt capacitors 30, 32 may be part of the structure of the active components 24, 26 rather than discretely implemented.

The symmetrical oscillator 20 also preferably includes first and second feedback circuits 40, 42, each including at least one reactive component, such as a capacitor, coupled between one of the respective gain terminals of the first and second active components 24, 26 and a common node 50. For example, the first feedback circuit 40 preferably includes a capacitor coupled between the emitter of the first active component 24 and the common node 50, while the second feedback circuit 42 preferably includes a capacitor coupled between the emitter of the second active component 26 and the common node 50. First and second feedback circuits 40, 42 and first and second feedback capacitors 40, 42 will be referred to interchangeably. The respective other gain terminals of the first and second active components 24, 26 (e.g., the collectors) are preferably coupled together and connected to a first reference potential 100, such as ground, or any other suitable reference potential.

Those skilled in the art will appreciate from the disclosure herein that the reactive element 22, and the inductor Lr in particular, define a fundamental resonant frequency, F, vis-à-vis the capacitances of one or more of the capacitors 34, 36, the shunt capacitors 30, 32, and/or the feedback capacitors 40, 42. The phrase "defining a fundamental resonant frequency" as used herein includes establishing a fundamental resonant frequency by way of the inductance value of inductor Lr when taken in combination with one or more of the above-listed capacitances. The fundamental resonant frequency, therefore, may be adjusted (i.e., a new fundamental frequency may be defined) by way of changing the inductance value of inductor Lr. Similarly, the fundamental resonant frequency may be changed by adjusting one or more of the above listed capacitances.

In accordance with at least one aspect of the invention, an output signal is taken at the common node 50, preferably with respect to the first reference potential 100 (e.g. ground). It has been found that a signal obtained at the common node 50 is rich in second harmonic frequencies of the fundamental resonant frequency (i.e., 2F frequencies), the fundamental resonant frequency having been substantially attenuated at the common node 50. Among the advantages of taking an output signal at common node 50 are substantially higher output power at the second harmonic frequency as well as a substantially flatter response over the frequency band of interest.

Figure 1:
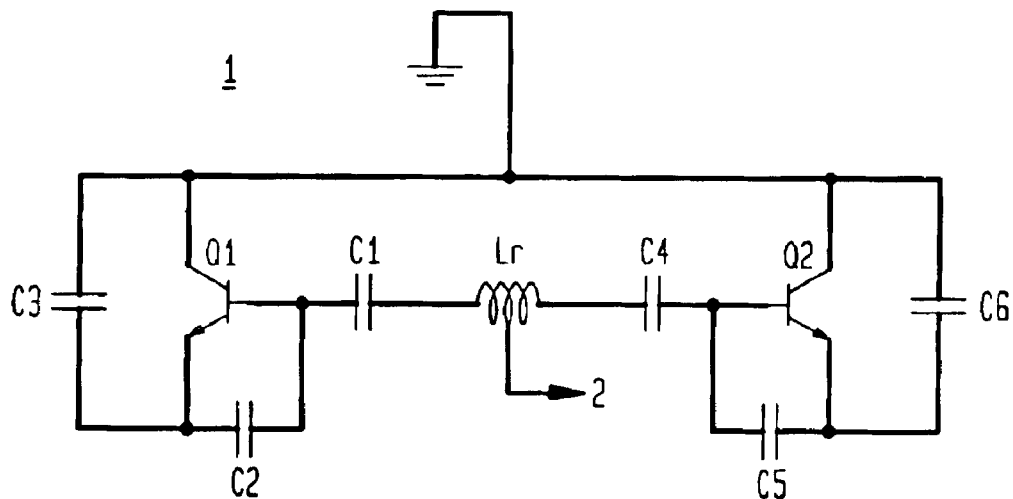
FIG. 1 is a simplified schematic diagram of a symmetrical oscillator in accordance with the prior art.
Figure 3A:
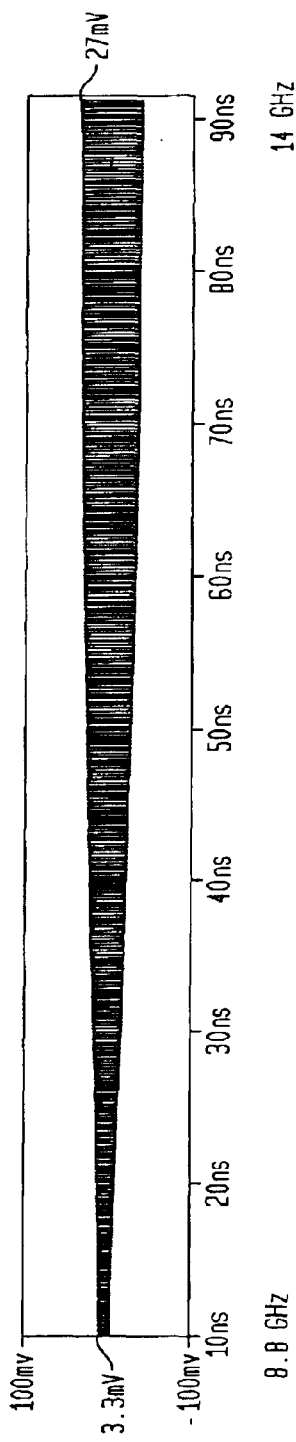
FIG. 3A is a computer simulation result of the output signal 2F from a symmetrical oscillator of the type shown in FIG. 1.
Figure 3B:
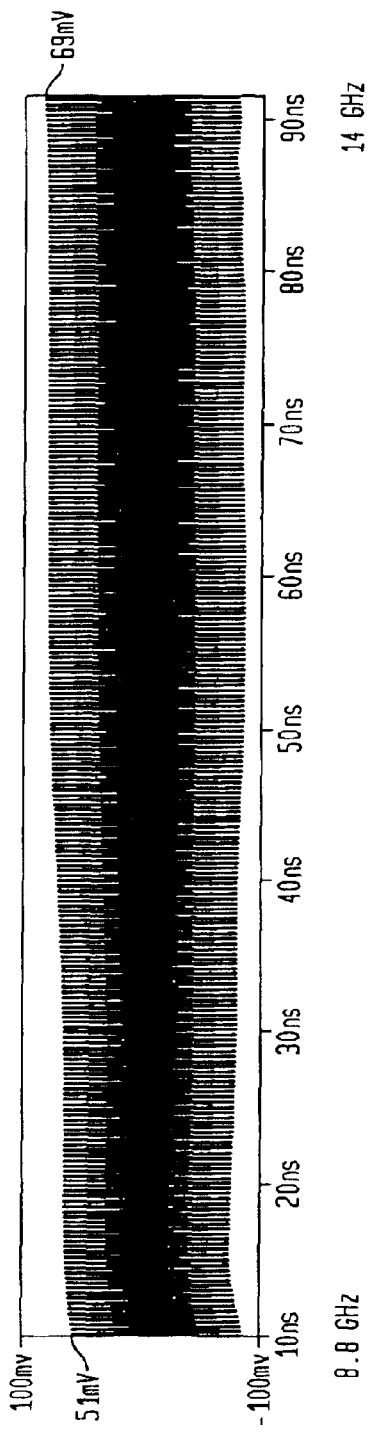
FIG. 3B is a computer simulation result of the output signal 2F from a symmetrical oscillator of the type shown in FIG. 2.

With reference to FIGS. 3A and 3B, simulations have shown that the amplitude of the output signal at common node 50 (when driving a 50 Ohm load, see FIGS. 5A–5B) in accordance with the present invention is at least 20 dB higher than that of the output signal at the center tap 2 of inductor Lr of the prior art symmetric oscillator shown in FIG. 1. FIG. 3A shows the output signal at the center tap 2 of inductor Lr of the prior art circuit of FIG. 1 over a frequency band beginning at 8.8 GHz and ending at 14 GHz. The amplitude of the output signal at the center tap 2 (into a 50 Ohm load) is 3.3 mV (RMS) at 8.8 GHz and increases to 27 mV (RMS) at 14 GHz. FIG. 3B shows that the amplitude of the output signal at the common node 50 (into a 50 Ohm load) of a symmetric oscillator of the present invention (similar to the oscillator 20 of FIG. 2) is 51 mV (RMS) at 8.8 GHz and 69 mV (RMS) at 14 GHz. Advantageously, the amplitude of the output signal at the common node 50 of the symmetric oscillator 20 of the present invention is more than 20 dB greater than that of the output signal at the center tap 2 of the prior art symmetrical oscillator 1 (FIG. 1). Moreover, the amplitude of the output signal at the common node 50 of the symmetrical oscillator 20 of the present invention is substantially flat, increasing only about 2.6 dB from 8.8 GHz to 14 GHz. In contrast, the amplitude of the output signal at the center tap 2 of the prior art circuit 1 (FIG. 1) increases about 18 dB over the same frequency range. While the present invention is not limited by any theory of operation, it is believed that the advantages of the symmetrical oscillator 20 of the present invention are at least partially the result of avoiding the reactive properties of the reactive element 22 (e.g., the inductor Lr) by an taking the 2F output at the common node 50.

Figure 4:
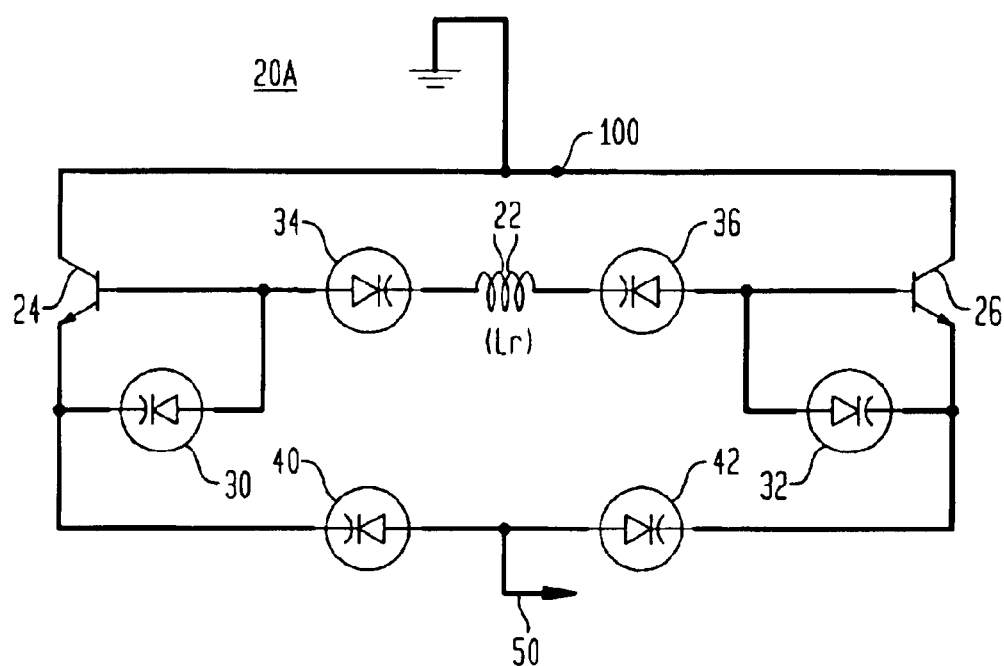
FIG. 4 is a simplified schematic diagram of a voltage controlled symmetrical oscillator in accordance with one or more aspects of the present invention.

Reference is now made to FIG. 4, which is a schematic diagram of a variable frequency symmetrical oscillator 20A in accordance with one or more further aspects of the present invention. The topology of the oscillator 20A of FIG. 4 is substantially similar to that of FIG. 2. A variable frequency output signal is obtained from common node 50 by adjusting the inductance of the reactive element 22 and/or the capacitance(s) of the shunt capacitors 30, 32, the capacitors 34, 36, and/or the feedback capacitors 40, 42. It is preferred that the variability in the output signal frequency (and the second harmonic output signal at common node 50 in particular) is obtained by adjusting one or more of the capacitances of the shunt capacitors 30, 32, the capacitors 34, 36, and the feedback capacitors 40, 42. The adjustment may be obtained mechanically and/or electrically, where the use of microwave frequency varactor diodes (as shown) is most preferred. The voltage dependence of the diode depletion-layer capacitances of the pn junctions of the varactor diodes is preferably adjustable by way of bias voltage(s) (not shown), which may be produced using any of the known techniques. Those skilled in the art will appreciate from the disclosure herein that the symmetrical oscillator 20A of FIG. 4 operates as a voltage controlled oscillator (VCO), where the output frequency at the common node 50 is a function of the bias voltage(s) imposed on one or more of the varactor diodes 30, 32, 34, 36, 40, 42. It is noted that other devices may be employed as variable capacitors to vary the output frequency, such as microelectromechanical systems (MEMs).

Figure 5A:
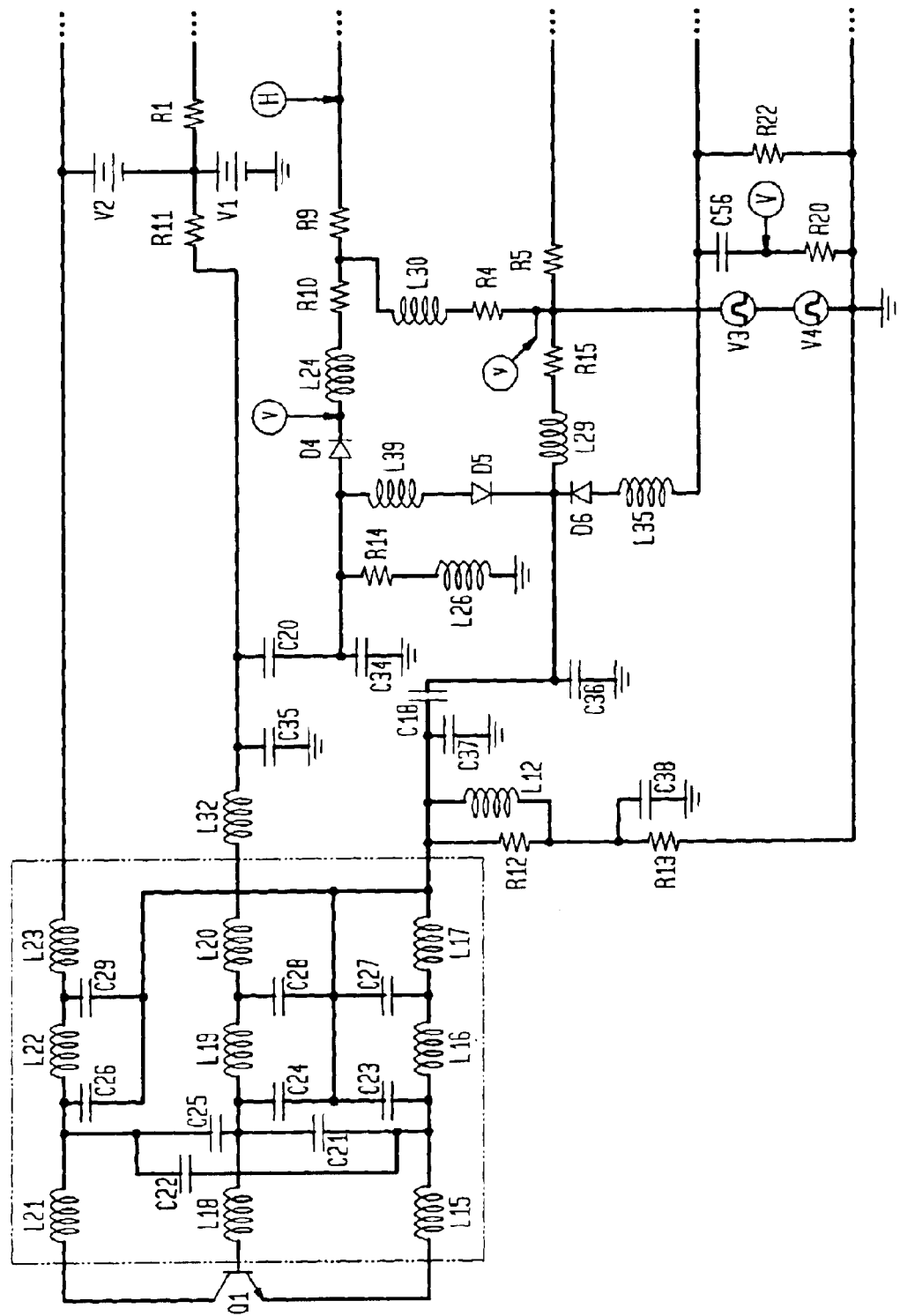
FIGS. 5A–5B are a more detailed schematic diagram of a symmetrical oscillator of the type shown in FIGS. 2 and 4, and which was utilized to produce the simulation result of FIG. 3B.
Figure 5B:
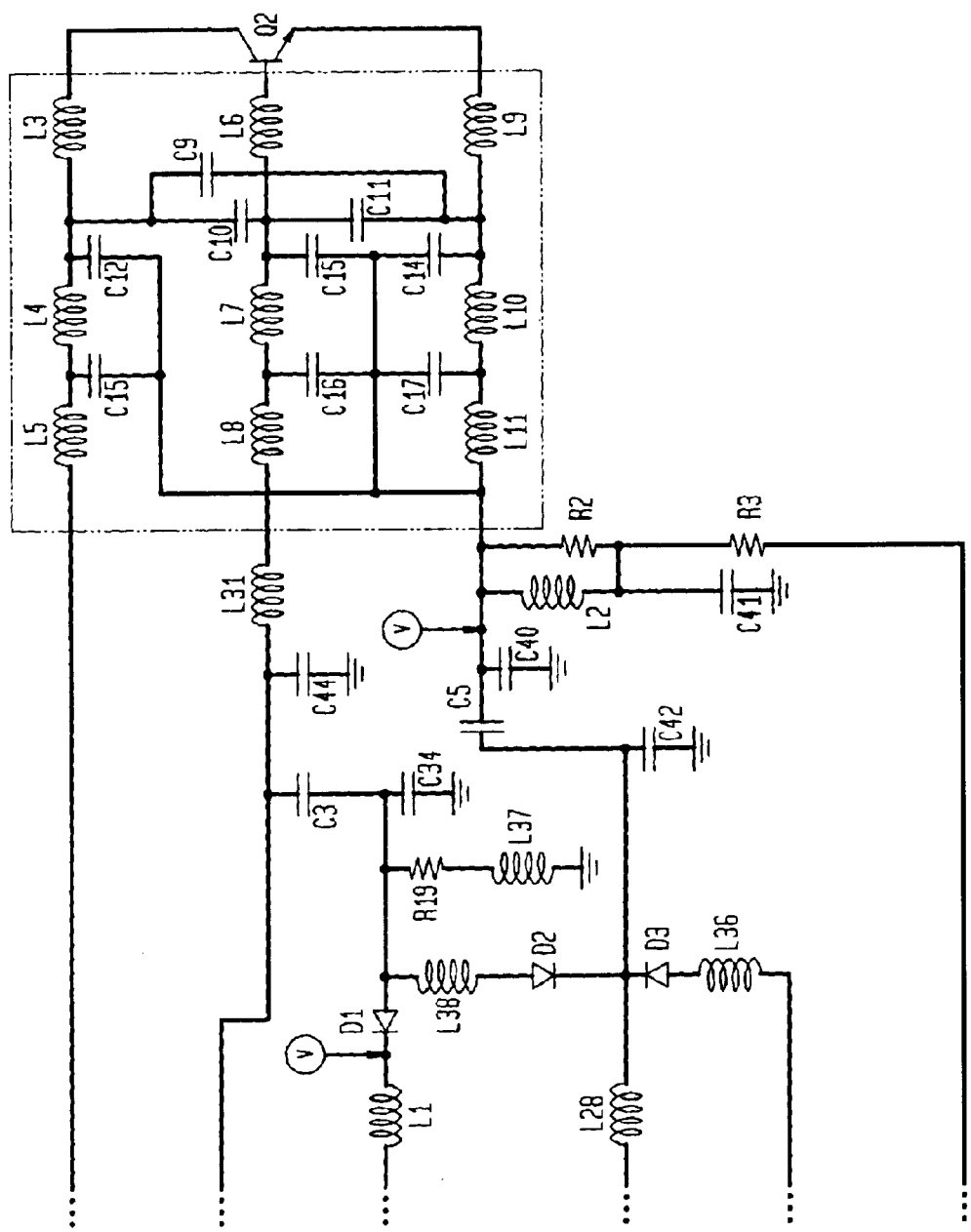

It is noted that the variable frequency output signal simulation data of FIG. 3B was obtained using a software simulation tool on which a detailed circuit similar to that shown in FIG. 4 was modeled. This detailed circuit is shown in FIGS. 5A–5B, where ancillary chokes, resistors, and capacitors used to provide varactor tuning biasing, DC biasing and AC bypassing and coupling are also shown. These ancillary parts have a minor influence on the RF/microwave performance.

Referring to FIG. 2, in accordance with one or more further aspects of the present invention, an output signal that is rich in energy at twice the fundamental resonant frequency, 2F, may be obtained at the first reference node 100 (i.e., at the common collectors of the first and second active components 24, 26) and/or at the common node 50 when an inductor (used as the reactive element 22) having a center tap is connected to a reference node, such as ground, and neither of the first reference node 100 nor the common node 50 are connected to that reference node. In accordance with yet another aspect of the present invention, the common node 50 may be coupled to a reference node, such as ground, and signals having energy rich in twice the fundamental resonant frequency, 2F, may be obtained at the first reference node 100 and/or the center tap (i.e., the electrical center of) of the inductor 22. It is believed, however, that obtaining the output signal either at the common node 50 or at the first reference node 100 (where the other of the common node 50 or the first reference node 100 is coupled to a suitable reference node, e.g., a return such as ground) is most advantageous inasmuch as the output power is relatively higher and flatter over frequencies of interest.

The examples of the invention illustrated in FIGS. 2 and 4 are shown in the common-collector configuration. The invention, however, is well suited for use in other configurations, such as the common-emitter configuration of FIG. 6. The symmetrical oscillator 20B shown in FIG. 6 includes a low inductance output inductor (or transformer) 22A coupled between gain terminals (i.e., the collectors) of active components 24, 26, preferably by way of respective capacitors 52, 54. The inductor 22A is at least part of a feedback circuit. The path should remain primarily capacitive over the frequency range of interest. First and second reactive elements 22B, 22C are preferably coupled between the respective gain terminals (i.e., the collectors) and the drive terminals (i.e., the bases) of active components 24, 26. It is most preferred that the first and second reactive elements 22B, 22C include inductors coupled between those terminals by way of respective capacitors 56, 58. A first shunt circuit 60, preferably formed from one or more capacitors, is coupled between the drive terminal (i.e., the base) of active component 24 and a common node 50. A second shunt circuit 62, preferably formed from one or more capacitors, is coupled between the drive terminal (i.e., the base) of active component 26 and the common node 50. The other gain terminals (i.e., the emitters) of the active components 24, 26 are commonly coupled to a first reference node 102, such as ground.

Figure 6:
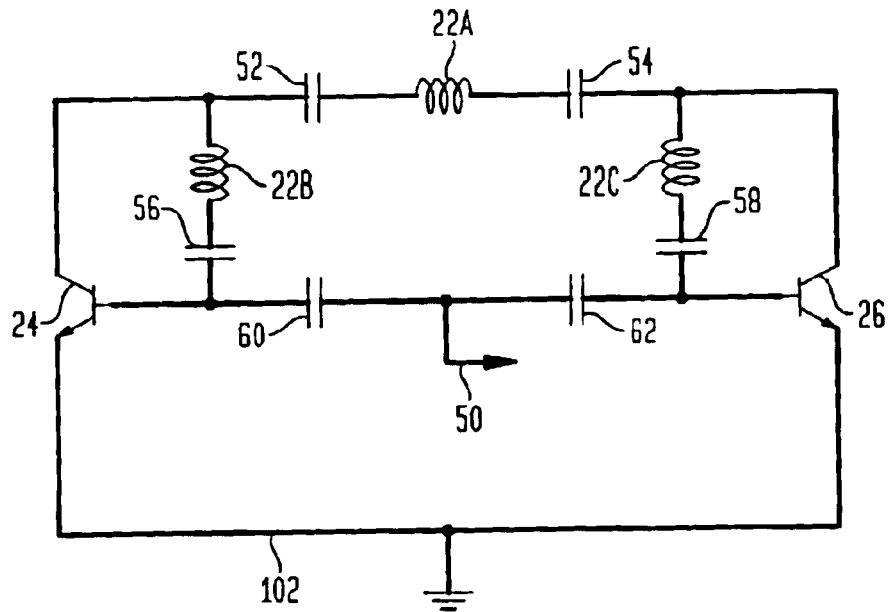
FIG. 6 is a simplified schematic diagram of a symmetrical oscillator of another topology in accordance with one or more aspects of the present invention.

An output signal at substantially two times the fundamental resonant frequency is advantageously obtained at the common node 50 of the symmetrical oscillator 20B illustrated in FIG. 6. It is believed that the output signal at common node 50 enjoys similar characteristics as the symmetrical oscillator 20 of FIG. 2, for example flatter response as a function of frequency compared to the 2F output at the center tap of reactive element 22A. It is noted that the inductor 22A if included in the feedback circuit may include a center tap (not shown), at the electrical center thereof, from which an additional output signal at substantially twice the fundamental resonant frequency may be obtained, albeit it is believed at a substantially lower output power and having less desirable flatness over frequencies of interest.

Referring again to FIG. 6, in accordance with one or more further aspects of the present invention, an output signal that is rich in energy at twice the fundamental resonant frequency, 2F, may be obtained at the first reference node 102 (i.e., at the common emitters of the first and second active components 24, 26) and/or the common node 50 when an inductor (which may be used in the feedback circuit at 22A) having a center tap (or the common node of capacitors 52, 54 without the inductors) is connected to a reference node, such as ground, and neither of the first reference node 102 nor the common node. 50 are connected to that reference node. In accordance with yet another aspect of the present invention, the common node 50 may be coupled to a reference node, such as ground, and signals having energy rich in twice the fundamental resonant frequency, 2F, may be obtained at the first reference node 102 and/or the center tap of the inductor at 22A (and/or at the common node of capacitors 52, 54 if the inductor 22A is not present). When inductor 22A is present, it is believed that obtaining the output signal at either the common node 50 or at the first reference node 102 (where the other of the common node 50 or the first reference node 102 is coupled to a suitable return) is most advantageous inasmuch as the output power is relatively higher and flatter over frequencies of interest.

Figure 7:
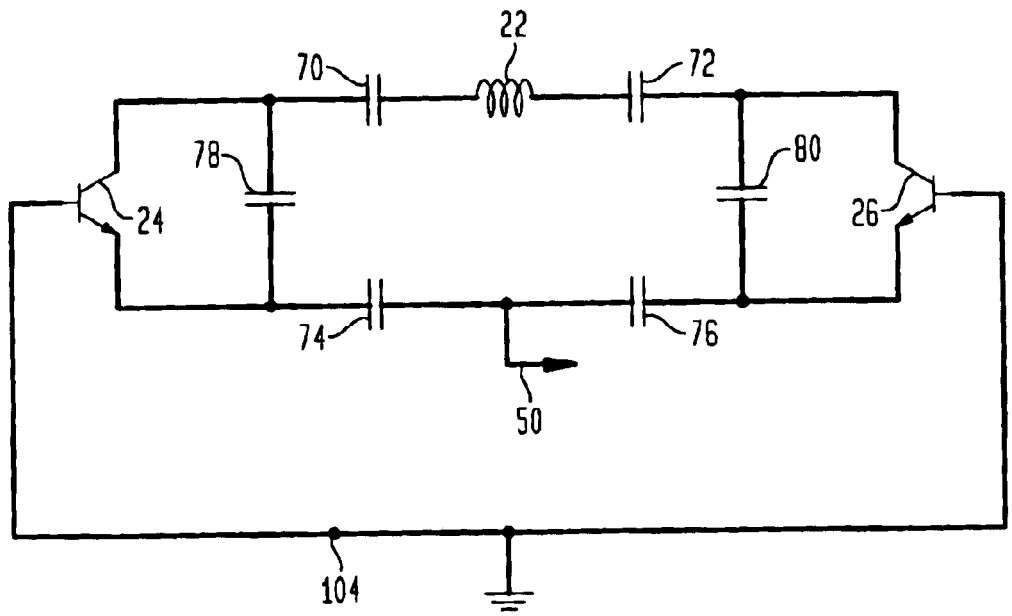
FIG. 7 is a simplified schematic diagram of a symmetrical oscillator of yet another topology in accordance with one or more aspects of the present invention.

The invention may also be implemented in the so-called common base configuration shown in FIG. 7. The symmetrical oscillator 20C of FIG. 7 includes a reactive element 22 coupled between gain terminals (i.e., the collectors) of active components 24, 26, preferably by way of capacitors 70, 72. A first shunt circuit 74, preferably formed from one or more capacitors, is coupled between the other of the gain terminals (i.e., the emitter) of active component 24 and a common node 50. A second shunt circuit 76, preferably formed from one or more capacitors, is coupled between the other of the gain terminals (i.e., the emitter) of active component 26 and the common node 50. Preferably, feedback capacitors 78, 80 are coupled across the respective gain terminals (i.e., the collector-emitter terminals) of active components 24, 26. The drive terminals (i.e., the bases) of the active components 24, 26 are preferably coupled towards a first reference node 104, for example, ground.

Advantageously, an output signal of substantially twice the fundamental resonant frequency may be obtained from common node 50. It is believe that the output signal at common node 50 enjoys similar characteristics as the output signal illustrated in FIG. 3B, discussed above with respect to FIG. 2 (i.e., it has a flatter output power response over the desired frequency range). It is noted that the reactive element 22 may include an inductor having a center tap (not shown) from which another output signal at substantially twice the fundamental resonant frequency may be obtained, albeit it is believed at a substantially less desirable flatness over the frequency range of interest.

In accordance with one or more further aspects of the present invention, an output signal that is rich in energy at twice the fundamental resonant frequency, 2F, may be obtained at the first reference node 104 (i.e., at the common bases of the first and second active components 24, 26) and/or at the common node 50 when an inductor (used as the reactive element 22) having a center tap connected to a reference node, such as ground, and neither of the first reference node 104 nor the common node 50 are connected to ground. In accordance with yet another aspect of the present invention, the common node 50 may be coupled to a reference node, such as ground, and signals having energy rich in twice the fundamental resonant frequency, 2F, may be obtained at the first reference node 104 and/or the center tap of the inductor 22. It is believed, however, that obtaining the output signal at either the common node 50 or at the first reference node 104 (where the other of the common node 50 or the first reference node 104 is coupled to a suitable return) is most advantageous inasmuch as the output power is relatively flatter over frequencies of interest.

Figure 8:
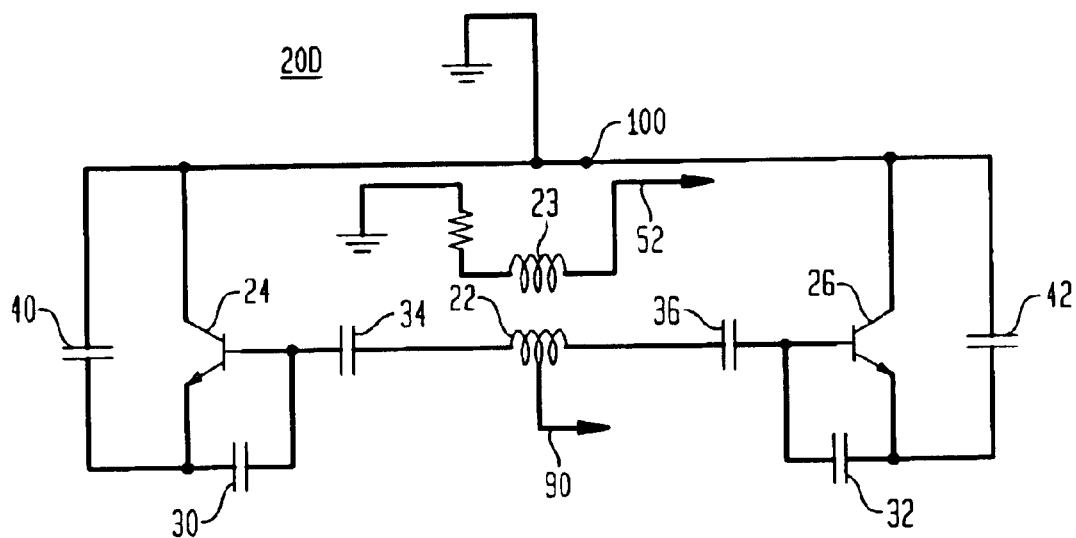
FIG. 8 is a simplified schematic diagram of another symmetrical oscillator in accordance with one or more further aspects of the present invention.

Reference is now made to FIG. 8, which shows a simplified schematic diagram of a symmetrical oscillator 20D in accordance with one or more further aspects of the present invention. In the oscillator 20D, the first and second feedback circuits 40, 42 are coupled to the reference node (e.g., ground) and an output signal at twice the fundamental resonant frequency is obtained from the reactive element 22 by way of a center tap 90. The reactive element preferably includes a first inductor 22 and an inductively coupled second inductor 23. One end of the second inductor 23 is preferably coupled towards a reference potential (e.g., towards ground through a resistance, such as 50 Ohms), and another output signal at substantially the fundamental resonant frequency is preferably obtained at an opposite end 52. It is noted that the one end of the second inductor 23 may be coupled towards a reference node other than ground as may be desired by the artisan. Advantageously, in accordance with one or more aspects of the invention, dual outputs, one at the fundamental resonant frequency from node 52 and another at twice the fundamental resonant frequency at center tap 90, simultaneously provide signal power covering a broader frequency range than a single output circuit. It is particularly desirable to obtain both outputs at nodes 52, 90 while also providing means for adjusting the fundamental resonant frequency, for example, by way of varactor diodes of the type shown in FIG. 4. This greatly increases the range of output signal frequencies obtained from the symmetrical oscillator 20D. For example, frequencies in the range from about 4.4 GHz through about 7.0 GHz may be obtained from the second inductor 23 at node 52, while an output signal of the range from about 8.8 GHz through about 14.0 GHz may be obtained from the reactive element 22 at the center tap 90.

Figure 9:
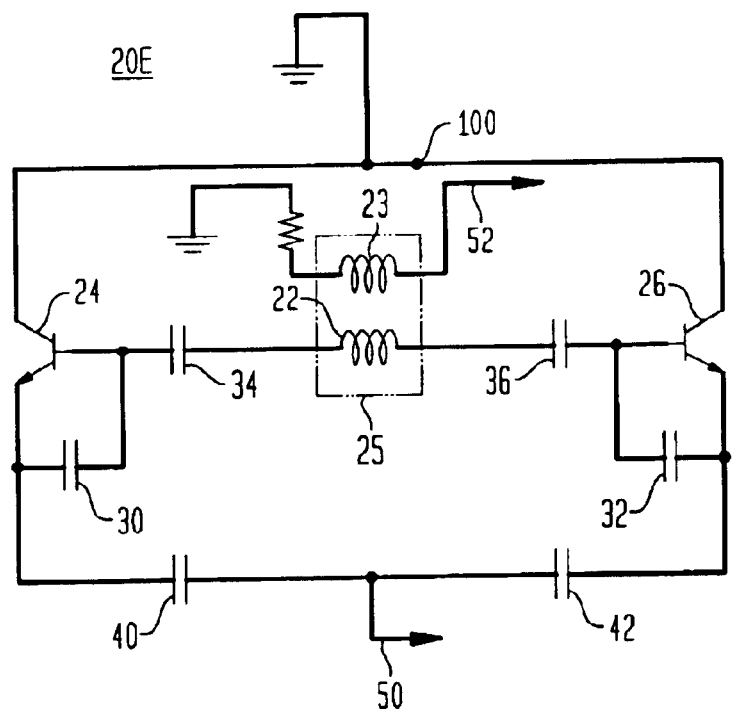
FIG. 9 is a simplified schematic diagram of yet another symmetrical oscillator in accordance with one or more further aspects of the present invention.

In order to obtain a higher power and flatter output signal at twice the fundamental frequency, it is preferred that two outputs are simultaneously obtained from a symmetrical oscillator 20E as shown in FIG. 9. The symmetrical oscillator 20E employs feedback circuits 40, 42 connected at the common node 50 such that an output signal of twice the fundamental frequency is obtained at that node. As was the case with the symmetrical oscillator 20 shown in FIG. 2, the symmetrical oscillator 20E of FIG. 9 yields an output signal having a high and flat output power response (e.g. shown in FIG. 3B for a 50 Ohm load) at the common node 50. In addition, an output signal at the fundamental resonant frequency is obtained via the second inductor 23 (which is inductively coupled to inductor 22) at node 52, where one end of the second inductor 23 is coupled to the reference node (or any other suitable reference node) via a resistor, preferably 50 Ohms. As the oscillation frequencies of interest are in the microwave range, the reactive element 22 and inductively coupled second inductor 23 are preferably implemented by way of a balanced directional coupler 25. Again, one or more of the capacitors of FIG. 9 may be implemented using varactor diodes.

It is noted that a second inductor 23 of the configuration shown in FIG. 9 may be employed in the common-emitter topology of FIG. 6 and/or the common-base topology of FIG. 7. With reference to FIG. 6, the second inductor 23 may be inductively coupled to inductor 22A, where one end of the second inductor 23 is coupled to the reference node (or any other suitable reference node) via a resistor, preferably 50 Ohms, and the other end is used as an output node at which an output signal at substantially the fundamental resonant frequency may be obtained. Likewise, with reference to FIG. 7, a second inductor 23 may be inductively coupled to inductor 22, where one end is coupled towards the reference node (or any other suitable reference node) through a resistor, preferably 50 Ohms, and the other end is used as an output node at which an output signal of substantially the fundamental resonant frequency may be obtained.

Figure 10:
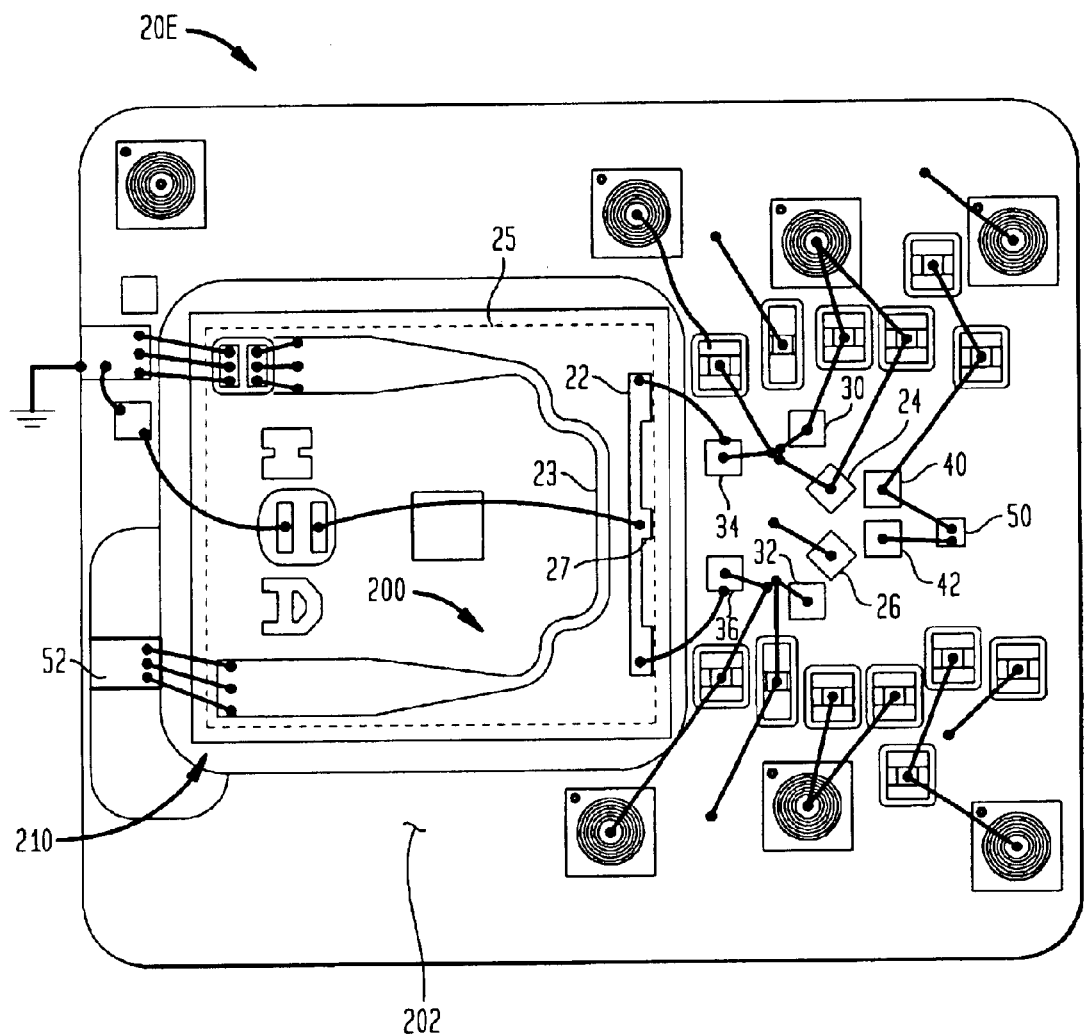
FIG. 10 is a top view of a hardware implementation of a symmetrical oscillator of the type illustrated in FIG. 9.

Reference is now made to FIG. 10, which is a top view of an actual circuit of the topology illustrated in FIG. 9, albeit employing more components such as chokes, biasing resistors, coupling and bypass capacitors, etc., as would be required to build a commercial oscillator. The inductor 22 preferably forms an input line of the directional coupler 25 and the second inductor 23 preferably forms a secondary (or output) line of the directional coupler 25. Of the many techniques for implementing a directional coupler known in the art, it is preferred that the microstrip-line technique is employed, i.e., where a dielectric material forms a substrate 200 and a conductive material is disposed on the surface of the dielectric material to form transmission lines. In accordance with this implementation of the invention, it is most preferred that the dielectric constant (k) of the dielectric material of the substrate 200 shown in FIG. 10 be low, e.g. where k is between about 2–3. Teflon-glass substrates, such as DUROID from the Rogers Corporation, are acceptable. The geometric dimensions of the microstrip-line forming the reactive element (inductor) 22 taken in conjunction with the dielectric properties of the substrate 200 establish the inductance Lr of the inductor 22. The inductance Lr defines the fundamental resonant frequency when taken in conjunction with capacitors 30, 32, 34, 36, 40 and 42. Similarly, the geometric dimensions of the second inductor 23 taken in conjunction with the dielectric properties of the substrate establish the electrical properties of that inductor. The physical distance between the inductor 22 and the second inductor 23 establishes an amount of coupling from the input line (inductor 22) to the output line (second inductor 23), usually measured in decibels. One end of the second inductor 23 is coupled toward ground through a 50 Ohm resistor. It is noted that the width of the conductive material of the second inductor 23 increases as it approaches the 50 Ohm resistor. This achieves an impedance transformation from a relatively higher impedance at the area of coupling to a lower impedance of the resistor (50 Ohms). The other end of the conductive material of the second inductor 23 terminates at an output node 52, where an output signal at the fundamental resonant frequency is obtained. It is noted that the width of the conductive material of the second inductor 23 also increases as it approaches the output node 52, again to obtain an impedance transformation to 50 Ohms.

The oscillator of FIG. 10 is implemented using varactor diodes, such as for capacitors 34, 36, shunt capacitors 30, 32, and feedback capacitors 40, 42. Active components 24, 26 are also shown, where NPN transistors are employed. Common node 50 is located where varactor diodes 40, 42 are commonly connected and the output signal is obtained at twice the fundamental resonant frequency at that point. Preferably a coupling capacitor is used to obtain the output signal from node 50. Both output signals are routed to output connecting pads using strip-line within a separate substrate 202 (preferably formed from ceramic) that surrounds the substrate 200.

It is most preferred that the substrate 200 be temperature compensated to avoid frequency drift. A suitable heater circuit for achieving such temperature compensation is disclosed in U.S. Provisional Patent Application No. 60/256,315, filed Dec. 18, 2000 entitled FAST RESPONSE, MULTIPLE-LOOP TEMPERATURE REGULATOR, the entire disclosure of which is incorporated herein by reference.

Among the many advantages of the present invention, as may be readily seen in FIG. 10, is that a center tap at the inductor 22 is not necessary. If a center tap were required, however, a conductor having a width substantially similar to that of the ends of the second inductor 23 (i.e., of relatively large width) would have to connect to the center location 27 of the inductor 22. Clearly this would require a substantially larger substrate to permit routing such a conductor to that location in such a way as to obtain low coupling to the second inductor 23. Even if the center tap were implemented using a relatively thin conductor, a substantially larger substrate would still be necessary to route the center tap conductor to the inductor 22. In addition, an undesirable amount of coupling would exist between a center tapped conductor (of any dimension) and the second inductor 23, resulting in undesirable second harmonic components of energy at the output node 52 and undesirable fundamental resonant frequency components at the center tapped output. In addition, a larger substrate dictates greater distances between some components and, thus, adding undesirable parasitic inductance to the oscillator and lowering the maximum possible frequency of oscillation. Advantageously, however, the invention enjoys a relatively small substrate and, therefore, a substantially smaller electronic package may be used inasmuch as the center tap conductor is not required. As discussed above, an output signal at twice the fundamental resonant frequency is obtained at the common node 50 (preferably by way of a coupling capacitor), which requires no real estate on the coupler substrate. This also ensures a high degree of electrical isolation (and mechanical isolation) between the output at node 52 and the output at node 50.

A further advantage of the invention involves the separate substrates 200, 202. Indeed, the coupler 25 (on substrate 200) may be customized to meet specific frequency range, output coupling, and/or output power requirements while the remainder of the circuit (on substrate 202) may be standardized. To this end, the substrate 202 is preferably formed from multi-layer ceramic material suitable for mounting semiconductor dice and other circuit components. The substrate 202 also preferably includes an aperture 210 (through-hole or cavity) into which the substrate 200 is disposed. Preferably the substrate 200 is formed from a soft material that may be readily pried out of the aperture 210 without damaging the substrate 202. Of course, one or more standard configurations of the substrate 200 may be employed such that desirable characteristics are obtained in the oscillator 20E by simply selecting one of the substrates 200 and disposing it in the aperture 210 of the substrate 202. This may be performed during manufacture or retrofit.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A symmetrical oscillator, comprising:

a first active component having a drive terminal and first and second gain terminals, one of the first and second gain terminals of the first active component being coupled to a first reference node;

a second active component having a drive terminal and first and second gain terminals, one of the first and second gain terminals of the second active component being coupled to the first reference node;

a reactive element coupled between the drive terminals of the first and second active components, the reactive element including a first inductor coupled between first and second terminals, and being coupled to the first and second active components by way of first and second capacitors formed from at least one of varactor diodes and microelectromechanical systems, each having one end connected to a respective one of the first and second terminals and another end coupled to a respective one of the drive terminals of the first and second active components, the reactive element at least partially defining a fundamental resonant frequency;

a first feedback circuit having at least one reactive component coupled between the other of the first and second gain terminals of the first active component and a common node; and a second feedback circuit having at least one reactive component coupled between the other of the first and second gain terminals of the second active component and the common node, wherein an output signal is taken from at least one of the reactive element, the common node, and the first reference node.

2. The symmetrical oscillator of claim 1, wherein one of an electrical center of the reactive element, the common node, and the first reference node, from which the output signal is not taken, is coupled to a second reference node such that the output signal has a frequency of substantially twice the fundamental resonant frequency.

3. The symmetrical oscillator of claim 2, wherein at least one of the first and second reference nodes are at ground potential.

4. The symmetrical oscillator of claim 1, wherein the reactive element and the at least one reactive components of the first and second feedback circuits at least partially define the fundamental resonant frequency.

5. The symmetrical oscillator of claim 1, wherein the reactive element, the first and second capacitors, and the reactive components of the first and second feedback circuits at least partially define the fundamental resonant frequency.

6. The symmetrical oscillator of claim 1, wherein the first inductor includes a center tap from which another output signal of substantially twice the fundamental resonant frequency may be obtained.

7. The symmetrical oscillator of claim 1, further comprising a second inductor inductively coupled to the first inductor and including a first end coupled toward a second reference node and a second end from which another output signal of substantially the fundamental resonant frequency may be obtained.

8. The symmetrical oscillator of claim 7, wherein the first and second inductors are formed from microstrip transmission lines.

9. The symmetrical oscillator of claim 7, wherein the first and second reference nodes are at a same potential.

10. The symmetrical oscillator of claim 1, wherein at least one of the first and second feedback circuits include a capacitor.

11. The symmetrical oscillator of claim 10, wherein, the capacitor of at least one of the first and second feedback circuits is one of a varactor diode and a microelectromechanical system.

12. The symmetrical oscillator of claim 10, wherein the reactive element, the reactive components of the first and second feedback circuits, and the capacitor of at least one of the first and second feedback circuits at least partially define the fundamental resonant frequency.

13. The symmetrical oscillator of claim 1, wherein at least one of the first and second active components is taken from the group consisting of bipolar transistors, field effect transistors, heterojunction bipolar transistors, silicon-germanium transistors, insulated gate bipolar transistors, and vacuum tubes.

14. The symmetrical oscillator of claim 13, wherein the first and second active components are bipolar transistors, respective bases of which are coupled to respective ends of the reactive element, collectors of which are coupled to the first reference node, and respective emitters of which are coupled to the first and second feedback circuits.

15. The symmetrical oscillator of claim 14, wherein the first and second active components are NPN bipolar transistors.

16. The symmetrical oscillator of claim 14, further comprising at least one shunt capacitor coupled between the base and emitter of at least one of the first and second active components.

17. The symmetrical oscillator of claim 16, wherein the reactive element, the reactive components of the first and second feedback circuits, and the at least one shunt capacitor at least partially define the fundamental resonant frequency.

18. The symmetrical oscillator of claim 14, further comprising one of a varactor diode and a microelectromechanical system coupled between the base and emitter of at least one of the first and second active components.

19. The symmetrical oscillator of claim 1, wherein a first output signal of substantially the fundamental resonant frequency is taken inductively from the reactive element and at least one second output signal of substantially twice the fundamental resonant frequency is taken from at least one of an electrical center of the reactive element, the common node, and the first reference node.

20. The symmetrical oscillator of claim 19, wherein one of the electrical center of the reactive element, the common node, and the first reference node, from which the second output signal is not taken, is coupled to a second reference node.

21. The symmetrical oscillator of claim 20, wherein the reactive element includes a first inductor coupled between the drive terminals of the first and second active components, and a second inductor inductively coupled to the first inductor having a first end coupled toward a third reference node and a second end from which the first output signal of substantially the fundamental resonant frequency is taken.

22. The symmetrical oscillator of claim 21, wherein the first, second and third reference nodes are at a same potential.

23. The symmetrical oscillator of claim 21, wherein the first and second inductors are formed from microstrip transmission lines.

24. A symmetrical oscillator, comprising:
a first active component having a drive terminal and first and second gain terminals, one of the first and second gain terminals of the first active component being coupled to a first reference node;

a second active component having a drive terminal and first and second gain terminals, one of the first and second gain terminals of the second active component being coupled to the first reference node;

a first reactive element coupled between the other of the first and second gain terminals of the first active component and the drive terminal of the first active component;

a second reactive element coupled between the other of the first and second gain terminals of the second active component and the drive terminal of the second active component, the first and second reactive elements at least partially defining a fundamental resonant frequency;

a first shunt circuit having at least one reactive component coupled between the drive terminal of the first active component and a common node;

a second shunt circuit having at least one reactive component coupled between the drive terminal of the second active component and the common node; and a feedback circuit coupled between the others of the first and second gain terminals of the first and second active components, wherein an output signal is taken from at least one of the feedback circuit, the common node, and the first reference node.

25. The symmetrical oscillator of claim 24, wherein one of an electrical center of the feedback circuit, the common node, and the first reference node, from which the output signal is not taken, is coupled to a second reference node, such that the output signal has a frequency of substantially twice the fundamental resonant frequency.

26. The symmetrical oscillator of claim 25, wherein at least one of the first and second reference nodes are at ground potential.

27. The symmetrical oscillator of claim 24, wherein the first and second reactive elements, the reactive components of the first and second shunt circuits, and the feedback circuit at least partially define the fundamental resonant frequency.

28. The symmetrical oscillator of claim 24, wherein at least one of the first and second reactive elements includes an inductor coupled between first and second terminals.

29. The symmetrical oscillator of claim 28, wherein the inductor of each of the first and second reactive elements is coupled to the first and second active components by way of first and second capacitors, respectively.

30. The symmetrical oscillator of claim 29, wherein at least one of the first and second capacitors are one of varactor diodes and microelectromechanical systems.

31. The symmetrical oscillator of claim 29, wherein the first and second reactive elements, the first and second capacitors, the at least one reactive components of the first and second shunt circuits, and the feedback circuit at least partially define the fundamental resonant frequency.

32. The symmetrical oscillator of claim 28, wherein the feedback circuit includes a second inductor coupled between the others of the first and second gain terminals of the first and second active components.

33. The symmetrical oscillator of claim 32, wherein the second inductor is coupled to the respective first and second active components by way of first and second capacitors.

34. The symmetrical oscillator of claim 33, wherein at least one of the first and second capacitors are one of varactor diodes and microelectromechanical systems.

35. The symmetrical oscillator of claim 33, wherein the first and second reactive elements, the first and second capacitors, and the reactive components of the first and second shunt circuits at least partially define the fundamental resonant frequency.

36. The symmetrical oscillator of claim 32, wherein the second inductor includes a center tap from which another output signal of substantially twice the fundamental resonant frequency may be obtained.

37. The symmetrical oscillator of claim 36, further comprising a third inductor inductively coupled to the second inductor and including a first end coupled toward a second reference node and a second end from which another output signal of substantially the fundamental resonant frequency may be obtained.

38. The symmetrical oscillator of claim 37, wherein the first and second reference nodes are at a same potential.

39. The symmetrical oscillator of claim 37, wherein the third and fourth inductors are formed from microstrip transmission lines.

40. The symmetrical oscillator of claim 24, wherein at least one of the first and second shunt circuits include a capacitor.

41. The symmetrical oscillator of claim 40, wherein the capacitor of at least one of the first and second shunt circuits is one of a varactor diode and a microelectromechanical system.

42. The symmetrical oscillator of claim 40, wherein the first and second reactive elements, the reactive components of the first and second shunt circuits, the capacitor of at least one of the first and second shunt circuits, and the feedback circuit at least partially define the fundamental resonant frequency.

43. The symmetrical oscillator of claim 24, wherein at least one of the first and second active components is taken from the group consisting of bipolar transistors, field effect transistors, heterojunction bipolar transistors, silicon-germanium transistors, insulated gate bipolar transistors, and vacuum tubes.

44. The symmetrical oscillator of claim 43, wherein the first and second active components are bipolar transistors, respective bases of which are coupled to respective ones of the first and second shunt circuits, collectors of which are coupled to respective ends of the feedback circuit, and respective emitters of which are coupled to the first reference node.

45. The symmetrical oscillator of claim 44, wherein the first and second active components are NPN bipolar transistors.

46. The symmetrical oscillator of claim 24, wherein a first output signal of substantially the fundamental resonant frequency is taken inductively from the feedback circuit and a second output signal of substantially twice the fundamental resonant frequency is taken from at least one of an electrical center of the feedback circuit, the common node, and the first reference node.

47. The symmetrical oscillator of claim 46, wherein one of the electrical center of the feedback circuit, the common node, and the first reference node, from which the second output signal is not taken, is coupled to a second reference node.

48. The symmetrical oscillator of claim 46, wherein the feedback circuit includes a first inductor coupled between the other of the first and second gain terminals of the first active component and the other of the first and second gain terminals of the second active component, and a second inductor inductively coupled to the first inductor having a first end coupled toward a third reference node and a second end from which the first output signal of substantially the fundamental resonant frequency is taken.

49. The symmetrical oscillator of claim 48, wherein the first, second and third reference nodes are at a same potential.

50. The symmetrical oscillator of claim 48, wherein the first and second inductors are formed from microstrip transmission lines.

51. A symmetrical oscillator, comprising:

a first active component having a drive terminal and first and second gain terminals, the drive terminal of the first active component being coupled to a first reference node;

a second active component having a drive terminal and first and second gain terminals, the drive terminal of the second active component being coupled to the first reference node;

a reactive element coupled between one of the first and second gain terminals of the first active component and one of the first and second gain terminals of the second active component, the reactive element at least partially defining a fundamental resonant frequency;

a first shunt circuit having at least one reactive component coupled between the other of the first and second gain terminals of the first active component and a common node; and a second shunt circuit having at least one reactive component coupled between the other of the first and second gain terminals of the second active component and the common node, wherein an output signal is taken from at least one of the reactive element, the common node, and the first reference node.

52. The symmetrical oscillator of claim 51, wherein one of an electrical center of the reactive element, the common node, and the first reference node, from which the output signal is not taken, is coupled to a second reference node such that the output signal has a frequency of substantially twice the fundamental resonant frequency.

53. The symmetrical oscillator of claim 52, wherein at least one of the first and second reference nodes are at ground potential.

54. The symmetrical oscillator of claim 51, wherein the reactive element and the reactive components of the first and second shunt circuits at least partially define the fundamental resonant frequency.

55. The symmetrical oscillator of claim 51, wherein the reactive element includes a first inductor coupled between first and second terminals.

56. The symmetrical oscillator of claim 55, wherein the reactive element is coupled to the first and second active components by way of first and second capacitors, each having one end connected to the reactive element and another end coupled to a respective one of the gain terminals of the first and second active components.

57. The symmetrical oscillator of claim 56, wherein the first and second capacitors are at least one of varactor diodes and microelectromechanical systems.

58. The symmetrical oscillator of claim 56, wherein the reactive element, the first and second capacitors, and the reactive components of the first and second shunt circuits at least partially define the fundamental resonant frequency.

59. The symmetrical oscillator of claim 55, wherein the first inductor includes a center tap from which another output signal of substantially twice the fundamental resonant frequency may be obtained.

60. The symmetrical oscillator of claim 55, further comprising a second inductor inductively coupled to the first inductor and including a first end coupled toward a second reference node and a second end from which another output signal of substantially the fundamental resonant frequency may be obtained.

61. The symmetrical oscillator of claim 60, wherein the first and second reference nodes are at a same potential.

62. The symmetrical oscillator of claim 60, wherein the first and second inductors are formed from microstrip transmission lines.

63. The symmetrical oscillator of claim 51, wherein at least one of the first and second shunt circuits include a capacitor.

64. The symmetrical oscillator of claim 63, wherein the capacitor of at least one of the first and second shunt circuits is one of a varactor diode and a microelectromechanical system.

65. The symmetrical oscillator of claim 63, wherein the reactive element, the reactive components of the first and second shunt circuits, and the capacitor of at least one of the first and second shunt circuits at least partially define the fundamental resonant frequency.

66. The symmetrical oscillator of claim 51, wherein at least one of the first and second active components is taken from the group consisting of bipolar transistors, field effect transistors, heterojunction bipolar transistors, silicon-germanium transistors, insulated gate bipolar transistors, and vacuum tubes.

67. The symmetrical oscillator of claim 66, wherein the first and second active components are bipolar transistors, respective bases of which are coupled to the first reference node, collectors of which are coupled to respective ends of the reactive element, and respective emitters of which are coupled to the first and second shunt circuits.

68. The symmetrical oscillator of claim 67, wherein the first and second active components are NPN bipolar transistors.

69. The symmetrical oscillator of claim 67, further comprising at least one feedback capacitor coupled between the collector and emitter of at least one of the first and second active components.

70. The symmetrical oscillator of claim 69, wherein the reactive element, the reactive components of the first and second feedback circuits, and the at least one shunt capacitor at least partially define the fundamental resonant frequency.

71. The symmetrical oscillator of claim 67, further comprising one of a varactor diode and a microelectromechanical system coupled between the collector and emitter of each of the first and second active components.

72. The symmetrical oscillator of claim 51, wherein a first output signal of substantially the fundamental resonant frequency is taken inductively from the reactive element and a second output signal of substantially twice the fundamental resonant frequency is taken from at least one of an electrical center of the reactive element, the common node, and the first reference node.

73. The symmetrical oscillator of claim 72, wherein one of the electrical center of the reactive element, the common node, and the first reference node, from which the second output signal is not taken, is coupled to a second reference node.

74. The symmetrical oscillator of claim 73, wherein the reactive element includes a first inductor coupled between the one of the first and second gain terminals of the first active component and the one of the first and second gain terminals of the second active component, and a second inductor inductively coupled to the first inductor having a first end coupled toward a third reference node and a second end from which the first output signal of substantially the fundamental resonant frequency is taken.

75. The symmetrical oscillator of claim 74, wherein the first, second and third reference nodes are at a same potential.

76. The symmetrical oscillator of claim 74, wherein the first and second inductors are formed from microstrip transmission lines.

* * * * *